(12) United States Patent
Selin (10) Patent No.: US 10,296,667 B2
(45) Date of Patent: May 21, 2019

(54) ACTION SPACE DEFINING OBJECT FOR COMPUTER AIDED DESIGN

(71) Applicant: MIKKELIN AMMATTIKORKEAKOULU OY, Mikkeli (FI)

(72) Inventor: Jukka-Pekka Selin, Mikkeli (FI)

(73) Assignee: KAAKKOIS-SUOMEN AMMATTIKORKEAKOULU OY, Mikkeli (FI)

(*) Notice: Subject to any disclaimer, the term of this patent is extended or adjusted under 35 U.S.C. 154(b) by 509 days.

(21) Appl. No.: 14/779,519

(22) PCT Filed: Mar. 21, 2014

(86) PCT No.: PCT/FI2014/050208
§ 371 (c)(1),
(2) Date: Sep. 23, 2015

(87) PCT Pub. No.: WO2014/154942
PCT Pub. Date: Oct. 2, 2014

(65) Prior Publication Data
US 2016/0055269 A1    Feb. 25, 2016

(30) Foreign Application Priority Data
Mar. 25, 2013   (FI) .................................... 20135286

(51) Int. Cl.
*G06F 17/50*   (2006.01)
*G06T 19/00*   (2011.01)
*H04N 5/247*   (2006.01)

(52) U.S. Cl.
CPC .......... *G06F 17/5004* (2013.01); *G06T 19/00* (2013.01); *H04N 5/247* (2013.01); *G06T 2210/04* (2013.01); *G06T 2219/012* (2013.01)

(58) Field of Classification Search
CPC ...... G06F 17/5004; G06T 19/00; H04N 5/247
USPC .............................................................. 703/1
See application file for complete search history.

(56) References Cited

U.S. PATENT DOCUMENTS

| 5,877,967 A | 3/1999 | O'Brien, Jr. |
| 6,075,605 A * | 6/2000 | Futamura ........... G01B 11/2518 250/559.22 |
| 6,546,356 B1 | 4/2003 | Genest |
| 6,549,288 B1 * | 4/2003 | Migdal ................. G01B 11/25 356/601 |

(Continued)

FOREIGN PATENT DOCUMENTS

EP   1 355 277 A2   10/2003
WO   WO 2011/079183 A1   6/2011

OTHER PUBLICATIONS

Yousefi et al. (Stereoscopic Visualization of Monocular Images in Photo Collections, IEEE, 2011) (Year: 2011).*

(Continued)

*Primary Examiner* — Kamini S Shah
*Assistant Examiner* — Iftekhar Khan
(74) *Attorney, Agent, or Firm* — Birch, Stewart, Kolasch & Birch, LLP (57) ABSTRACT

For designing rooms or buildings for specific purposes, like homes for elderly people, an action space object that can be read from a database to a CAD application is provided, the action space object defining a volume needed to carry out a specific activity/action.

11 Claims, 4 Drawing Sheets

(56) References Cited

U.S. PATENT DOCUMENTS

| | | | | |
|---|---|---|---|---|
| 7,289,662 | B2* | 10/2007 | Keaton | G06K 9/00201 345/419 |
| 7,801,708 | B2* | 9/2010 | Unal | G06K 9/00214 345/419 |
| 8,284,240 | B2* | 10/2012 | Saint-Pierre | G01B 11/03 348/42 |
| 8,941,641 | B2* | 1/2015 | Chen | G06T 19/00 345/419 |
| 8,988,453 | B2* | 3/2015 | Kang | G09G 3/36 345/600 |
| 9,846,963 | B2* | 12/2017 | Patkar | G06T 7/73 |
| 9,978,177 | B2* | 5/2018 | Mehr | G06T 17/205 |
| 2004/0184655 | A1* | 9/2004 | Ziegler | G06T 17/10 382/154 |
| 2005/0166163 | A1 | 7/2005 | Chang et al. | |
| 2009/0195401 | A1* | 8/2009 | Maroney | G06K 9/00335 340/686.6 |
| 2009/0232355 | A1* | 9/2009 | Minear | G06K 9/00201 382/103 |
| 2010/0194855 | A1* | 8/2010 | Mamiya | G01B 11/25 348/42 |
| 2010/0265316 | A1* | 10/2010 | Sali | H04N 13/254 348/46 |
| 2011/0055729 | A1* | 3/2011 | Mason | G06F 3/0425 715/753 |
| 2012/0177283 | A1* | 7/2012 | Wang | G06T 17/00 382/154 |
| 2012/0259594 | A1* | 10/2012 | Khan | G06T 13/60 703/1 |
| 2012/0265104 | A1* | 10/2012 | Menegon | G06K 9/00342 600/595 |
| 2012/0296610 | A1* | 11/2012 | Hailemariam | G06T 19/00 703/1 |
| 2013/0169681 | A1* | 7/2013 | Rasane | G06T 19/006 345/633 |
| 2014/0205146 | A1* | 7/2014 | Holz | G06T 7/251 382/103 |
| 2014/0325406 | A1* | 10/2014 | Rowe | G06F 3/0484 715/765 |
| 2015/0296188 | A1* | 10/2015 | Meganathan | H04N 7/181 348/143 |
| 2016/0125657 | A1* | 5/2016 | Suto | G09G 5/00 345/633 |

OTHER PUBLICATIONS

Shinde et al. (Ergonomic analysis of an assembly workstation to identify time consuming and fatigue causing factors using application of motion study, International Journal of Engineering and Technology (IJET), 2012) (Year: 2012).*

Mavrikios et al. (An approach to human motion analysis and modelling,International Journal of Industrial Ergonomics 36 (2006) 979-989 ) (Year: 2006).*

Kim et al. (3D Scene Reconstruction from Multiple Spherical Stereo Pairs, Int J Computer Vision (2013) 104:94-116) (Year: 2013).*

Kakadiaris et al. (3D Human Body Model Acquisition from Multiple Views, Proceedings of the Fifth International Conference on Computer Vision, Jun. 1995, pp. 618-623) (Year: 1995).*

Johari et al. (Developing 3D Viewing Model from 2D Stereo Pair with its Occlusion Ratio, International Journal of Image Processing, vol. (4): Issue (3), 2010) (Year: 2010).*

Kim et al. ("3D Scene Reconstruction from Multiple Spherical Stereo Pairs", Int J Connput Vis (2013) 104:94-116) (Year: 2013).*

Yousefi et al. ("Stereoscopic Visualization of Monocular Images in Photo Collections", IEEE, 2011, pp. 1-5) (Year: 2011).*

Battini et al., "New Methoddogical Framework to Improve Productivity and Ergonomics in Assembly System Design," International Journal of Industrial Ergonomics, Jan. 5, 2011, vol. 41, pp. 30-42.

Kangasaho et al.,"Pitkeä matematukka. Geometria," WSOY 2004, 3 pages.

Mavrikios et al., "An Approach to Human Motion Analysis and Modelling," International Journal of Industrial Ergonomics, Oct. 2. 2006, vol. 36, pp. 979-999.

Shinde et al., "Ergonomic Analysis of an Assembly Workstation to Identify Time Consuming and Fatigue Causing Factors Using Application of Motion Study," International Juournal of Engineering and Technology (IJET), Aug.-Sep. 2012), vol. 4, No. 4, pp. 220-227.

Kakadiaris et al., "Three-Dimensional Human Body Model Acquisition from Multiple Views," International Journal of Computer Vision, vol. 30, No. 3, Dec. 1, 1998, pp. 191-218, XP-000800304.

* cited by examiner

ACTION SPACE DEFINING OBJECT FOR COMPUTER AIDED DESIGN

FIELD

The present invention relates to computer aided design.

BACKGROUND ART

The development of data processing systems, computers and computer applications has brought about a tremendous expansion of the use of technology and computers in connection with designing and building structures, for example. There are several different computer aided design (CAD) applications for drafting and design of all types of buildings, from small residential types (houses) to the largest commercial and industrial structures (hospitals and factories). CAD has been mainly used for detailed engineering of 3D models and/or 2D drawings of physical components, but it is nowadays used throughout the engineering process from conceptual design and layout of products, trough structural design and manufacturing to maintenance. Furthermore, many CAD applications now offer advanced rendering and animation capabilities so that a designer (i.e. a person using the CAD application), for example, will have a better insight.

There are different regulations and recommendations that should be taken into account when designing a new building and rooms in the building, or when renovating a building. Although some of the regulations and recommendations are in electronic form and obtainable from databases, they are still rather laborious to use. For example, when using ARVI database provided by the Housing Finance Development Center of Finland a designer designing a building targeted to a special group, such as handicapped persons or aging people with a memory disorder, like Alzheimer's disease or dementia, has to select an inhabitant type, then limitations of the inhabitant and after that the room type, and the result of the database query is a list of regulations and recommendations. The designer then interprets and combines the information on the list so that the designer can check that an already modeled room is large enough, but not too large, for the purpose, or uses the information to model the room.

SUMMARY

A general aspect of the present invention relates to facilitating designing, including renovating, a building intended to a specific use by means of information in an easy to use format. The invention is defined in methods, a computer program product, an apparatus and an arrangement which are characterized by what is stated in the independent claims. The preferred embodiments of the invention are disclosed in the dependent claims.

An aspect of the invention provides an action space object that can be read from a database to a CAD application, the action space object defining volume needed to carry out a specific activity/action.

BRIEF DESCRIPTION OF THE DRAWINGS

In the following different embodiments will be described in greater detail with reference to the attached drawings, in which.

DETAILED DESCRIPTION OF SOME EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

Figure 1:
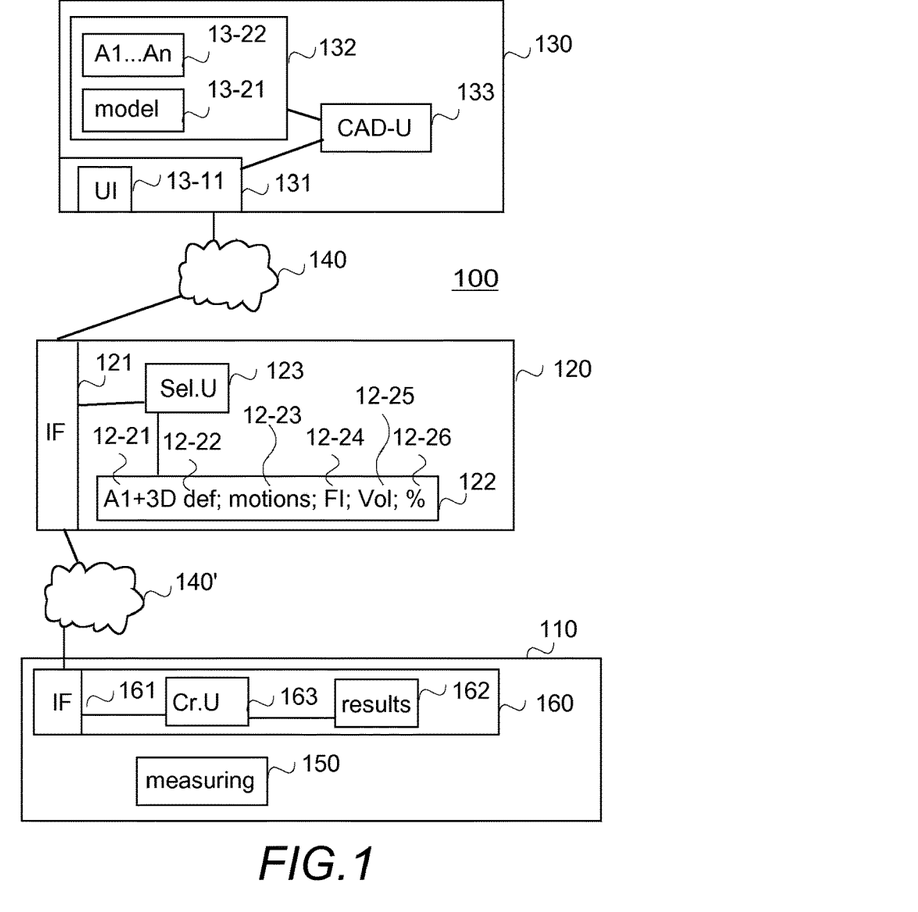
FIG. 1 is a simplified architecture of an exemplary system having schematic block diagrams of exemplary apparatuses.

A general architecture of an exemplary system 100 is illustrated in FIG. 1. FIG. 1 is a simplified system architecture only showing some elements and functional entities, all being logical units whose implementation may differ from what is shown. The connections shown in FIG. 1 are logical connections; the actual physical connections may be different. It is apparent to a person skilled in the art that the systems also comprise other functions and structures that are not illustrated.

The simplified system illustrated in FIG. 1 comprises one or more environments 110 (only one shown in FIG. 1) for creating action space objects, a server 120 and one or more apparatuses 130 (only one shown in FIG. 1) configured to create 3D models of buildings, the server 120 being connectable over networks 140, 140'. A network 140, 140' may be a wireless network or a fixed network or a combination of a wireless network and a fixed network. Instead of a network connection a direct connection may be used. It should be appreciated that it bears no significance to the invention how the apparatuses and server are connected and what protocols and applications are used in information exchange, and therefore they are not described in more detail here.

The environment 110 comprises a measuring arrangement 150 described in more detail with FIGS. 4A, 4B, 4C and 5 and one or more apparatuses 160 (only one shown in FIG. 1) configured to create action space objects from measurement results obtained from the measuring arrangement 150 as will be described in more detail below with FIG. 6. For that purpose, the apparatus 160 illustrated in FIG. 1 comprises one or more interfaces 161 (only one shown in FIG. 1) for information exchange, one or more memories 162 (only one shown in FIG. 1) for storing the measurement results and created action space objects at least temporarily and a creator unit 163 (Cr.U) configured to create the action space objects. Examples of such an apparatus 160 include a personal computer, a laptop, a tablet computer and a smart phone. The way the measurement results are delivered from the measuring arrangement to the one or more memories bears no significance to the invention, and any delivery mean may be used. Examples of such include sending results in real-time either wirelessly or over a wired connection, or delivering them via a removable memory or delivering them in one or more files over a connection.

The server 120 comprises one or more interface units 121 for information exchange, one or more memories including a database 122 for storing at least action space objects and a selector unit 123 (Sel.U) configured to assist in selection and retrieval of action space objects as will be described below. In the illustrated example, the database 122 associates an action space object, comprising an identifier 12-21 and 3D shape definitions 12-22, with motion definitions 12-23 used, a country or countries 12-24 whose regulations and recommendations were used for defining the motion definitions, volume 12-25 of the object, and a statistical probability 12-26 of the action/activity to be performed according to the motion definitions. The identifier 12-21 may be any kind of an identifier, like a name describing the action, a mere code, a code associated with some descriptive information or any combination thereof. For example the identifier may comprise a unique code and a distinguishing summary part, such as "s122, showering, one person, one helping person", "s123, showering, one person, walker, no helping person", "s124, showering, one person, a wheelchair, one helping person", "s125, showering, one person, a wheelchair and a hoist, one helping person", "s126, showering, one person, a wheelchair and a hoist, two helping persons", etc. The statistical probability 12-26 is useful for activities/actions which may be performed in alternative ways which in turn may require a different amount and/or different shape of the space. For example, the dimensions of a shower room in an old-age home may depend on average height of people in the specific country, is the shower room also for persons using wheel-chairs and/or for showering bedpatients or for persons able to walk and stand by themselves or with a walker, how many nurses are needed, which kind of auxiliary equipments there are, etc. and the motion definitions may indicate the information, and the statistical probability may indicate how frequent the situation is. If there are no building volume restrictions, the one with the largest volume may be selected. Instead of the statistical probability, or in addition to it, classification information may be provided. An example of such information includes International Classification of Functioning, Disability and Health (ICF) which is a classification of the health components of functioning and disability. However, it should be appreciated that it suffices to store action space objects, the other information is additional information. Further, it should be appreciated that the server 120 represents herein a server system comprising one or more server apparatuses.

The apparatus 130 depicts an apparatus a designer is using, and it may be called a designer apparatus. In other words, the apparatus 130 may be any apparatus with which a model or a part of it may be created and/or edited. Examples of such an apparatus 130 include a personal computer, a laptop, a tablet computer, and a smart phone. The apparatus 130 comprises one or more interface units 131 for information exchange, like the user interface 13-11, one or more memories 132 (only one shown in FIG. 1) for storing a model 13-21 at least temporarily and CAD unit 133 (CAD-U) for creating and/or modifying the model by means of a CAD application. The CAD application may be any computer-aided designing/modeling applications/programs. In the illustrated example the memory also contains action space objects 13-22 retrieved from the server and stored at least temporarily.

In an exemplary functionality, the selector unit in the server interacts with the designer apparatus by outputting information via the user interface for the designer to select an action space object and receiving designer selections via the user interface, and by forwarding space objects to the memory for at least temporary storage, and the interaction may be controlled by means of the CAD unit.

Figure 2:
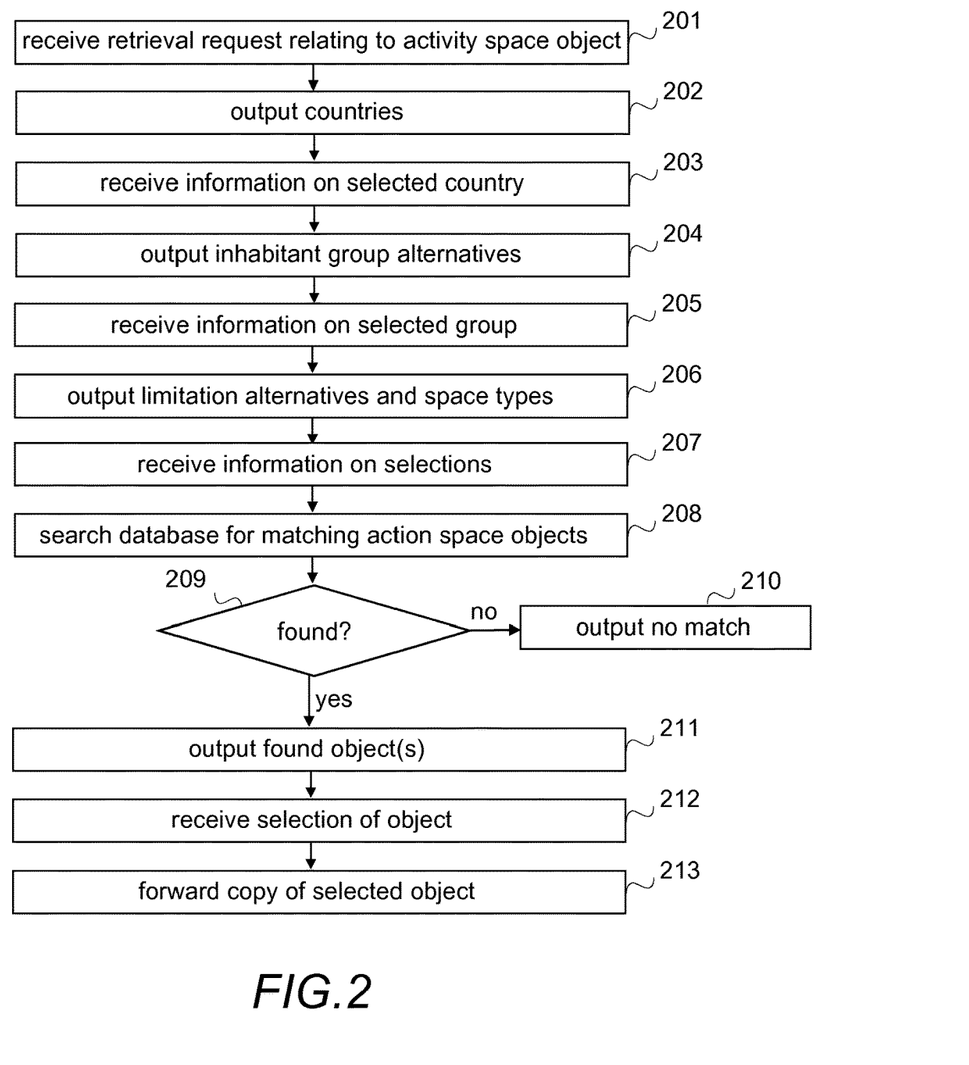
FIGS. 2, 3, 5 and 6 are flow chart illustrating exemplary functionalities.

FIG. 2 is a flow chart illustrating the exemplary functionality in the server, and more precisely FIG. 2 illustrates exemplary functionality of the selector unit relating to the interaction.

In response to receiving (step 201) a retrieval request relating to action space objects, a list of countries for which space objects exist is outputted in step 202. When information on a selected country is received in step 203, alternatives of intended use and/or inhabitant groups for which space objects exists in the selected country is outputted in step 204. When information on a selected group is received in step 205, alternatives of possible limitations within the group and alternative space types are outputted in step 206. When a space type selection and either an indication that no limitations are selected or one or more selected limitations are received in step 207, the database containing the action space objects are searched for in step 208, using the received selections as search criteria. If, for some reason no action space objects are found (step 209), an indication that nothing was found is outputted in step 210. Otherwise, all found action space objects with corresponding probability information are outputted in step 211, and when a selection of an action space object is received in step 212, a copy of the selected object is forwarded in step 213 to the designer apparatus. The designer apparatus then stores, at least temporarily, the action space object.

It should be appreciated that the lists, alternatives and other information outputted may be in any form determined to be usable, there are no restrictions. For example, a list may be an ordered list or a list in alphabetic order. Further, it should be appreciated that the lists are preferably but not necessarily implemented in a way that a latest selection is considered as a valid selection in cases, like the country, where only one of the alternatives can be selected whereas if several simultaneous selections are possible, all selections are considered as valid ones.

Figure 3:
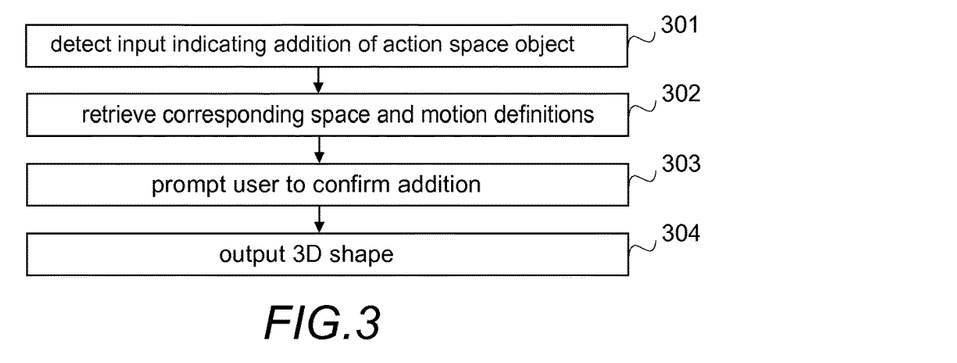

FIG. 3 illustrates an exemplary functionality of the designer apparatus when the designer utilizes an action space object. In the example it is illustrated that the memory of the designer apparatus comprises one or more action space objects, and that they are shown to the designer as selectable objects.

When an input indicating an addition of an action space object is detected in step 301, corresponding space object definitions, and in the illustrated example also motion definitions with a short summary relating to the specific action to which the action space object relates, are retrieved in step 302, and the designer is prompted in step 303 via the user interface to confirm the selection. The summary may shortly describe the action for which the space object is, the person or persons involved and/or auxiliary devices involved, and it may be part of an identifier. The designer may be prompted by outputting to a screen "You are adding an action space object relating to a helper showering a person using a wheelchair. Please confirm." If the designer confirms the selections, i.e. the action space object is for the intended activity/action, a 3D shape is outputted in step 304 to the model, more precisely to the point of the model where the input of the addition was detected, the shape being visible to the designer via the user interface. The designer can then check, whether the intended room space, for example, is too small or too large, or to create a room using the 3D shape as an aid object. Thanks to that it is easy to ensure that the space suits for the intended use, and the designer avoids interpretation of different instructions and combining of them. Further, having a space of a proper size instead of an over dimensioned space, results to a smaller building and lower energy consumption, or a building having more rooms. In addition, having a space of a proper size instead of an under dimensioned space, results to avoiding costly renovation for the space to fit for purpose.

The 3D shaped object is movable within the model, and more than one action space object may overlap. For example, a 3D volume for showering a person in a wheelchair and a 3D volume for showering a person using a walker may be overlapped by the designer so that the designer can ensure that both kind of persons can be showered in a shower room under design.

Further, in an implementation, a designer may store the motion definitions, or an associated video file, as additional information of the room to a building information model of the building so that the motion definitions, or the associated video file, may be retrieved by selecting the room in the building information model even years after the building has been built. In other words, a point within or near a space into which the 3D object was placed, or indicated to be placed is associated with the information.

Figure 4A:
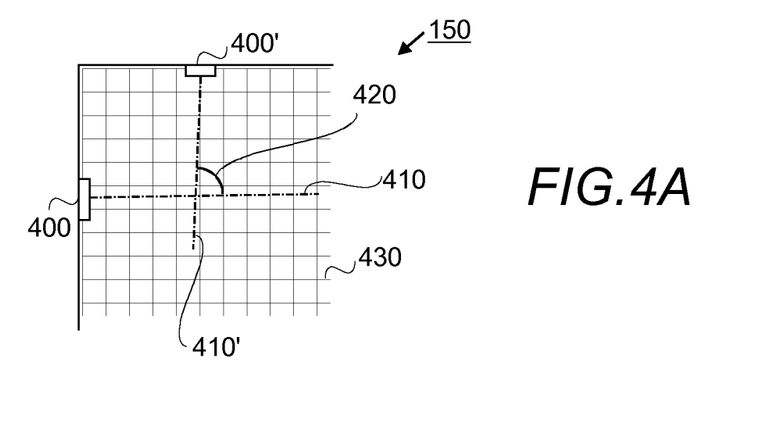
FIGS. 4A to 4C are schematic block diagrams illustrating an exemplary arrangement.

FIG. 4A illustrates an exemplary arrangement for measuring a space for an action performed by means of recording movements seen from above. The measuring arrangement may be called also a recording arrangement.

The illustrated exemplary measuring arrangement 150 comprises two recording means 400, 400' positioned so that their recording axes 410, 410' intersects at an angle 420. The angle is preferably between 80° to 100°, an optimum being 90° so that there will be no shadow areas and accurate enough 3D dimensioning will be possible. However, there is no strict limit, and a suitable angle value depends on the needed accuracy and on a complexity of the shape. An angle between 75° to 105°, for example, may be used without any disadvantageous shadow areas and errors in the measurements results. Further, in the illustrated example, the ground comprises a grid 430 as an aiding tool for dimensioning, especially if the dimensioning is assisted by a person.

The recording means 400, 400' may be digital video cameras or they may be laser scanners, for example of a type shooting a laser beam matrix to tens of solid angles per second, or one them may be a video camera and the other one a laser scanner. A video camera covers here also a camera configured to take photographs in series with very short intervals, thereby forming a kind of a video or a video clip.

Figure 4B:
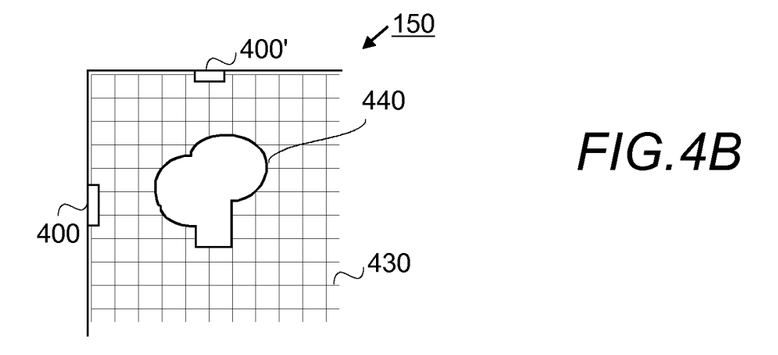
Figure 4C:
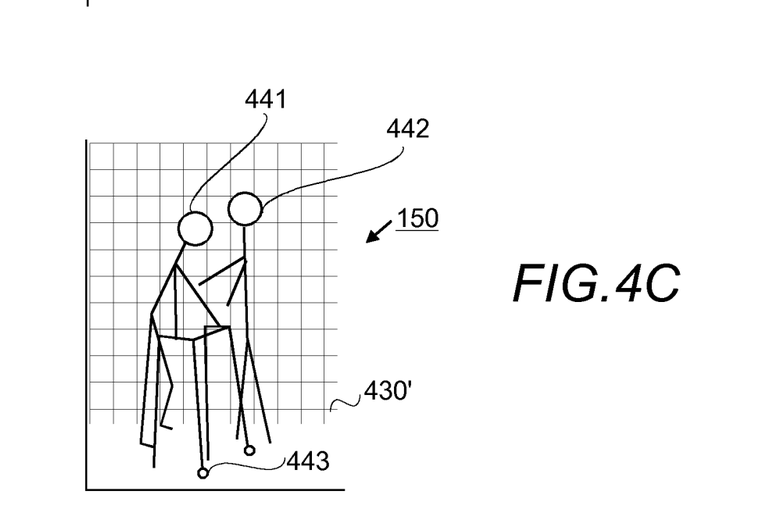

FIGS. 4B and 4C illustrates an exemplary recording situation in the recording arrangement 150 of FIG. 4A, FIG. 4B from above and FIG. 4C as seen from one of the recording means 400, 400'. As can be seen from FIG. 4C, there is a grid 430' positioned against the recording means. In the illustrated example the arrangement comprises three grids, two positioned against the two recording means and one at the bottom. It should be appreciated that the grids may have different sizes. The recording means, or the start situation of a specific activity is positioned preferably but not necessarily so that optical axes intersects horizontally and vertically approximately in an estimated center of mass of one or more persons and zero or more means involved in the specific activity.

The recording means record at least outline information 440 in each phase of a specific activity, when the specific activity/action is performed. In the illustrated example the specific activity includes a person 441, his/her auxiliary means 443, and another person 442 helping the person 441. It should be appreciated that any number of persons starting from one, any number of auxiliary means starting from zero and any number of helping persons starting from zero may be involved in the specific activity. Below the one or more persons and zero or more auxiliary means involved are called a complex.

Figure 5:
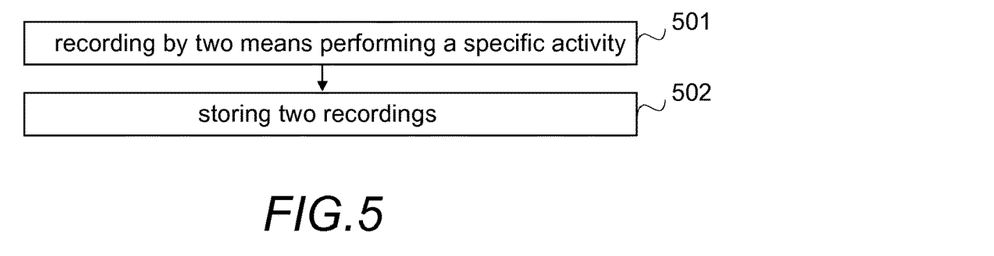

FIG. 5 illustrates an exemplary recording situation. A prerequisite for the recording situation is that there are at least some detailed motion definitions for the activity to be performed. In the example it is assumed that there exists detailed motion definitions comprising series of motions specified so that the repeatability of the motions is almost 100% and that they define the best practice to perform the specific activity. This ensures that a 3D action space object created corresponds to an authentic situation. However, 3D action space objects may be created by using recordings obtained by the persons involved improvising during recording.

While the one or more persons are performing the action/activity according to detailed motion definitions the two recording means are recording in step 501 simultaneously the movements, actions and use and place of the possible auxiliary means, and the recordings are stored as measurement results in step 502 recording means—specifically to be processed as will be described below with FIG. 6. The recordings may be stored temporarily to the recording means, or from the recording means to an external memory or directly to the memory in the apparatus that creates the action space objects from the recordings. The recordings may be stored in any format.

Figure 6:
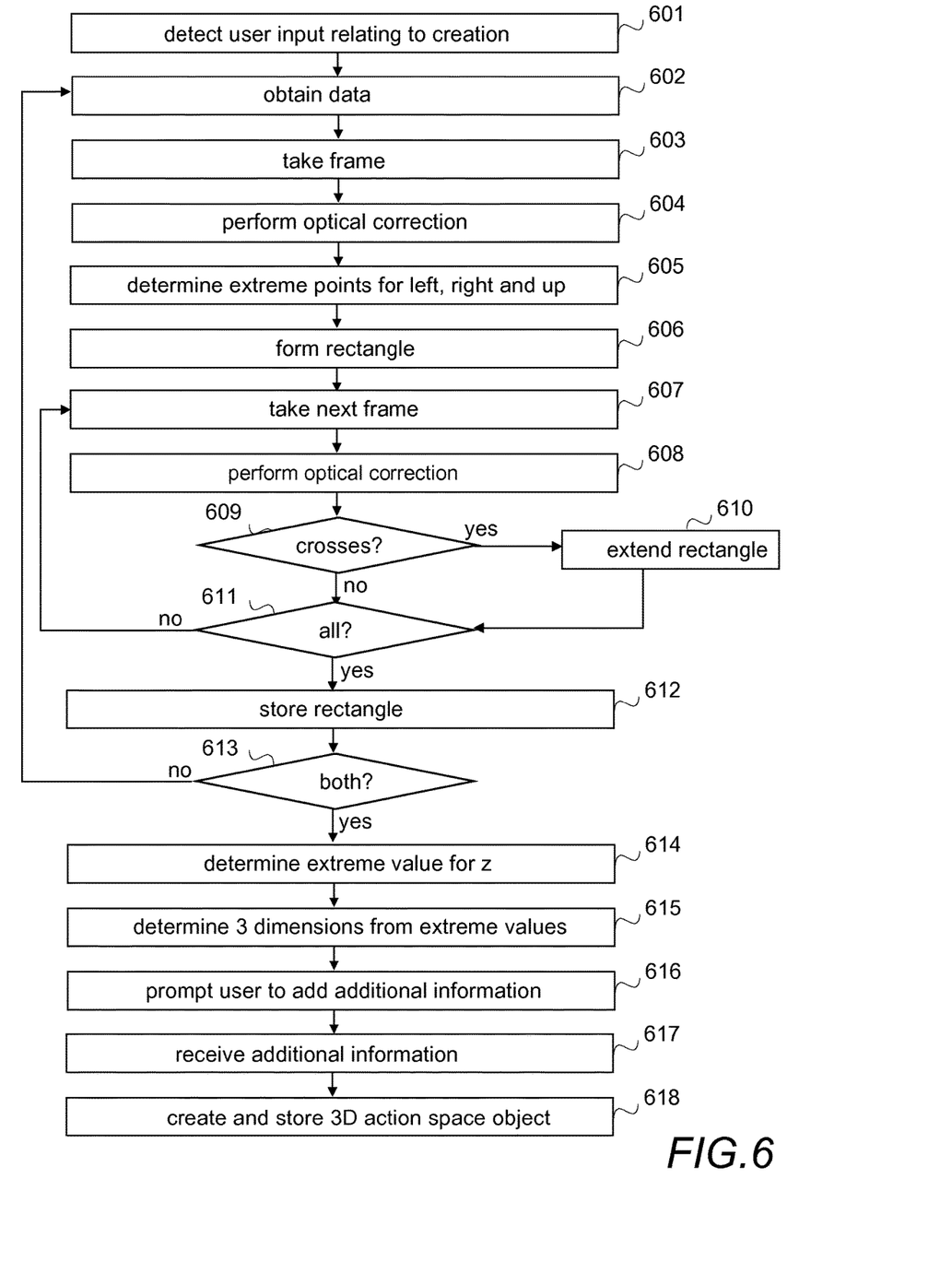

FIG. 6 illustrates an exemplary functionality of an apparatus configured to create action space objects from the recordings. More precisely, FIG. 6 illustrates functionality of a creator unit. The functionality may utilize interoperability between following languages: HyperText Markup Language version 5 (HTML5), Cascading Style Sheets (CSS) language, and JavaScript programming language.

In the example of FIG. 6 it is assumed that the recording means are video cameras, but a similar process may be applied to the results obtained from the laser scanner(s). Further, in the illustrated example it is assumed, for the sake of clarity, that the action space object will be a polyhedron comprising six sides, without restricting the example to such a shape and to the described image processing algorithm. Still another assumption made is that the ground or floor is the bottom extreme in vertical direction. Depending on an implementation and the image processing tool/application used, a person may input the extreme points by means of user interfaces, or the image processing tool/application may be configured to use it.

In response to detecting in step 601 a user input indicating creation of a specific action space object, for example by the user storing corresponding data or clicking a file containing the data, data representing recordings from one of the cameras is obtained in step 602 to be processed. The data is processed in the illustrated example in a frame by frame fashion. A first frame is taken in step 603, and an optical correction is performed to the frame in step 604. Then extremes of the outlines are determined in point 605 by determining a point in the left hand side and a point in the right hand side nearest to edge side of the grid and belonging to an outer line of the complex in horizontal direction and an upmost point in the vertical direction, and a rectangle is formed via the points in step 606. Then a next frame is taken in step 607, and an optical correction is performed to the frame in step 608. Then it is checked, in step 609 whether or not the outer line of the complex in the frame crosses the rectangle. If it crosses, the rectangle is extended in step 610 so that the outmost point on the outer line that crossed over will be on the border of the rectangle. Then it is checked in step 611, whether or not all frames are processed. If all frames are not processed, the next frame is taken in step 607.

If the outer line does not cross the rectangle (step 609) it is checked in step 611, whether or not all frames are processed.

If all frames are processed (step 611), the rectangle defines coordinates for a 2 dimensional representation of space needed for performing the activity and they, or the rectangle are stored in step 612 at least temporarily. Then it is checked in step 613 whether or not both recordings are processed. If not, data representing recordings from the other one of the cameras is obtained in step 602 to be processed.

If recordings from both cameras are processed (step 613) one of the rectangles defines extreme values for x- and z-coordinates, and the other extreme values for y- and z-coordinates. To have only one z-coordinate, the one having the bigger value is selected in step 614 to be the extreme value for z-coordinate. Then three dimensions are determined in step 615 from the extreme values, the user is prompted in step 616 to add additional information, like the short summary and/or motion definitions and/or video and/ or video clip(s) and/or a link to related/corresponding information, and after receiving in step 617 the additional information or an indication that no additional information will be given, a 3D action space object is created in step 618, the 3D additional object either comprising the additional information or some of it, or being associated during the creation with the additional information.

Then the 3D action space object and possible additional information are stored in step 618. The 3D action space object is preferably stored in a CAD application independent format, like a data type called IFC (Industry Foundation Classes). IFC is a data representation standard and file format to facilitate interoperability of different data created in the building industry. However, it should be appreciated that the file format(s) of the data used bear(s) no significance and means other than the common storage format to obtain data exchange between different applications may be used. An IFC object comprises program instructions in EXPRESS data modelling language which then interprets the dimension definitions so that the 3D action space object will have a proper shape.

Further, the object may be stored in addition to IFC or instead of IFC in one or more CAD application formats. Examples of such include Autodesk® Revit® and Tekla Structures.

Although in the above the 3D action space object defined dimensions for a regular polyhedron, it should be appreciated that with a more detailed extreme defining, like using the grid as an assisting tool to define extreme values for wideness at certain "height areas", or any other known means, more complex shapes of 3D action space objects may be defined. The dimension definitions of a 3D action space object may define a cuboid, a cone, a cylinder, a sphere or any polyhedron, or any combination thereof.

For example, when using recordings from a laser scanner, the outline of the complex may be determined by using solid angles reflecting the point in which a laser beam did not hit the complex.

Although in the above it is assumed that two recording means are used for obtaining outline information needed to define the 3D shape, it should be appreciated that three or more recording means may be used as well.

An apparatus configured to implement one or more functionalities of an apparatus or unit described above, is a computing device that may be any apparatus or device or equipment or a server configured to perform one or more of corresponding apparatus functionalities described with an embodiment/example/implementation, and it may be configured to perform functionalities from different embodiments/examples/implementations. The unit(s) described with an apparatus may be separate units, even located in another physical apparatus, the physical apparatuses forming one logical apparatus providing the functionality, or integrated to another unit in the same apparatus. In other embodiments, a unit in an apparatus, or part of the unit's functionality, may be located in another physical apparatus. It should be appreciated that the apparatus may be in one physical apparatus or distributed to two or more physical apparatuses acting as one logical apparatus.

More precisely, the units (illustrated in FIG. 1) may be software and/or software-hardware and/or firmware components (recorded indelibly on a medium such as read-only-memory or embodied in hard-wired computer circuitry). The techniques described herein may be implemented by various means so that an apparatus implementing one or more functions of a corresponding apparatus/entity described with an embodiment/example/implementation comprises not only prior art means, but also means for implementing the one or more functions of a corresponding apparatus described with an embodiment and it may comprise separate means for each separate function, or means may be configured to perform two or more functions. For example, these techniques may be implemented in hardware (one or more apparatuses), firmware (one or more apparatuses), software (one or more modules), or combinations thereof. For a firmware or software, implementation can be through modules (e.g., procedures, functions, and so on) that perform the functions described herein. Software codes may be stored in any suitable, processor/computer-readable data storage medium(s) or memory unit(s) or article(s) of manufacture and executed by one or more processors/computers.

An apparatus configured to provide one or more of the units illustrated in FIG. 1 or one or more corresponding functionalities, may generally include a processor, controller, control unit, micro-controller, or the like connected to a memory and to various interfaces of the apparatus. Generally the processor is a central processing unit, but the processor may be an additional operation processor. Each or some or one of the units described herein may be configured as a computer or a processor, or a microprocessor, such as a single-chip computer element, or as a chipset, including at least a memory for providing storage area used for arithmetic operation and an operation processor for executing the arithmetic operation. Each or some or one of the units/ entities described above may comprise one or more computer processors, application-specific integrated circuits (ASIC), digital signal processors (DSP), digital signal processing devices (DSPD), programmable logic devices (PLD), field-programmable gate arrays (FPGA), and/or other hardware components that have been programmed in such a way to carry out one or more functions of one or more embodiments. In other words, each or some or one of the units/entities described above may be an element that comprises one or more arithmetic logic units, a number of special registers and control circuits.

Further, an apparatus implementing functionality or some functionality according to an embodiment/example/implementation described above may generally include volatile and/or non-volatile memory, for example EEPROM, ROM, PROM, RAM, DRAM, SRAM, double floating-gate field effect transistor, firmware, programmable logic, etc. and typically store content, data, or the like. The memory or memories, especially when a database is provided, may be of any type (different from each other), have any possible storage structure and, if required, being managed by any database management system. The memory may also store computer program code such as software applications (for example, for one or more of the units/entities) or operating systems, information, data, content, or the like for the processor to perform steps associated with operation of the apparatus in accordance with embodiments. The memory, or part of it, may be, for example, random access memory, a hard drive, or other fixed data memory or storage device implemented within the processor/apparatus or external to the processor/apparatus in which case it can be communicatively coupled to the processor/network node via various means as is known in the art. Examples of an external memory include a removable memory detachably connected to the apparatus, a distributed database and a cloud server.

An apparatus implementing functionality or some functionality according to an embodiment/example/implementation described above may generally comprise different interface units, such as one or more receiving units for receiving user data, control information, requests and responses, for example, and one or more sending units for sending user data, control information, responses and requests, for example, and one or more user interfaces for receiving user inputs and for outputting information to a user, like the designer. The receiving unit and the transmitting unit each provides an interface in an apparatus, the interface including a transmitter and/or a receiver or any other means for receiving and/or transmitting information, and performing necessary functions so that content and other user data, control information, etc. can be received and/or transmitted.

Further, an apparatus implementing functionality or some functionality according to an embodiment/example/implementation may comprise other units, like a user interface unit for maintenance.

The steps and related functions described above in FIGS. 2, 3, 5 and 6 are in no absolute chronological order, and some of the steps may be performed simultaneously or in an order differing from the given one. Other functions can also be executed between the steps or within the steps. An example include purchase steps after the designer has selected the object he/she wants to retrieve from the database (i.e. after step 212) and before delivery of the object in step 213. Some of the steps or part of the steps can also be left out or replaced by a corresponding step or part of the step. For example, if the cameras can be placed far enough from the complex, and normal objective lenses are used instead of wide angle lenses, the optical correction steps of 604 and 608 may be left out.

It will be obvious to a person skilled in the art that, as the technology advances, the inventive concept can be implemented in various ways. The invention and its embodiments are not limited to the examples described above but may vary within the scope of the claims.

The invention claimed is:

1. A computer implemented method comprising:
  providing first and second recorders in a space, wherein the first and second recorders are positioned so that their recording axes intersect at an angle of 75° to 105°;
  recording, simultaneously with the first and second recorders, a specific activity performed by at least one person to obtain first data via the first recorder and second data via the second recorder, wherein the specific activity includes activity to be performed in the space, wherein the recording includes for each of the first and second recorders:
  a. obtaining a first frame;
  b. performing optical correction of the first frame;
  c. determining extreme values of the first frame;
  d. forming a rectangle based on the determined extreme values of the first frame;
  e. obtaining a subsequent frame;
  f. performing optical correction of the subsequent frame;
  g. determining extreme values of the subsequent frame;
  h. if the extreme value the subsequent frames crosses the formed rectangle, the rectangle is expanded to the extreme value of the subsequent frame; and
  i. repeating steps e-h until all frames have been processed;
  determining x, y and z dimensions from the rectangle;
  prompting the user to add additional information;
  creating a 3D action space object based on the determined x, y and z dimensions and the additional information, the 3D action space object illustrating a space needed for performing the specific activity by at least one person;
  storing the 3D action space object; and
  designing a room based on the stored 3D action space object that indicates a required space for the specific activity,
  wherein one of the first and second recorders is a video camera and the other is a laser scanner.

2. The method as claimed in claim 1, further comprising:
  obtaining motion definitions according to which the specific activity is performed; and
  associating the 3D action space object with the motion definitions.

3. The method as claimed in claim 1, further comprising associating the 3D action space object with at least one of the video or one or more video clip.

4. The method as claimed in claim 1, wherein the creating includes defining the 3D action space object at least according to Industry Foundation Classes (IFC) definitions or according to definitions of a computer aided design application.

5. The method as claimed in claim 1, wherein the 3D action space object defines a cuboid, a cone, a cylinder, a sphere or a polyhedron, or any combination thereof.

6. An apparatus comprising at least one processor and at least one memory including computer program code, wherein the at least one memory and the computer program code are configured to, with the at least one processor, implement a method comprising at least the following steps:
  recording, simultaneously with first and second recorders, a specific activity performed by at least one person to obtain first data via the first recorder and second data via the second recorder, wherein the specific activity includes activity to be performed in the space, wherein the first and second recorders are positioned so that their recording axes intersect at an angle of 75° to 105°,
  wherein the recording includes for each of the first and second recorders:
  a. obtaining a first frame;
  b. performing optical correction of the first frame;
  c. determining extreme values of the first frame;
  d. forming a rectangle based on the determined extreme values of the first frame;
  e. obtaining a subsequent frame;
  f. performing optical correction of the subsequent frame;
  g. determining extreme values of the subsequent frame;
  h. if the extreme value the subsequent frames crosses the formed rectangle, the rectangle is expanded to the extreme value of the subsequent frame; and
  i. repeating steps e-h until all frames have been processed;
  determining x, y and z dimensions from the rectangle;
  prompting the user to add additional information;
  creating a 3D action space object based on the determined x, y and z dimensions and the additional information, the 3D action space object illustrating a space needed for performing the specific activity by at least one person;

storing the 3D action space object; and designing a room based on the stored 3D action space object that indicates a required space for the specific activity, wherein the first and second recorders are one of a video camera and a laser scanner.

7. An arrangement comprising:

at least two recorders positioned so that their recording axis will intersect, the two recorders being configured to record simultaneously at least activity related outline information when a specific activity is performed by at least one person;

at least one non-volatile memory whereto the recorded outline information from each recorder is stored; and at least one apparatus comprising at least one processor and at least one memory including computer program code, wherein the at least one memory and the computer program code are configured to, with the at least one processor, implement a method comprising at least the following steps:

obtaining, from the non-volatile memory, at least a first data that include video or one or more video clip or laser scanner measurements and represents a specific activity performed by at least one person, and a second data that differs from the first data in the way that it includes video or one or more video clip or laser scanner measurements that represents the same specific activity from a different direction, wherein the obtaining comprises:

a. obtaining a first frame;

b. performing optical correction of the first frame;

c. determining extreme values of the first frame;

d. forming a rectangle based on the determined extreme values of the first frame;

e. obtaining a subsequent frame;

f. performing optical correction of the subsequent frame;

g. determining extreme values of the subsequent frame;

h. if the extreme value the subsequent frames crosses the formed rectangle, the rectangle is expanded to the extreme value of the subsequent frame; and i. repeating steps e-h until all frames have been processed;

determining x, y and z dimensions from the rectangle;

prompting the user to add additional information;

creating a 3D action space object based on the x, v and z dimensions and the additional information, the 3D action space object illustrating a space needed for performing the specific activity by at least one person;

storing the 3D action space object; and designing a room based on the stored 3D action space object that indicates a required space for the specific activity, wherein the at least two second recorders comprise a video camera and a laser scanner.

8. The arrangement according to claim 7, the arrangement further comprising two or more grids, one of the grids being positioned against one of the at least two recorders.

9. The arrangement according to claim 7, the arrangement comprising two recorders positioned so that the intersection angle is between 75° to 105°, and one of the recorders being a video camera and the other a laser scanner.

10. The arrangement according to claim 7, the arrangement comprising two recorders positioned so that the intersection angle is between 80° to 100°, and one of the recorders being a video camera and the other a laser scanner.

11. The method as claimed in claim 1, further comprising building the designed room.

* * * * *